United States Patent [19]
Bergman et al.

[11] Patent Number: 5,954,911
[45] Date of Patent: Sep. 21, 1999

[54] SEMICONDUCTOR PROCESSING USING VAPOR MIXTURES

[75] Inventors: Eric J. Bergman; Robert W. Berner; David Oberlitner, all of Kalispell, Mont.

[73] Assignee: Semitool, Inc., Kalispell, Mont.

[21] Appl. No.: 08/607,627

[22] Filed: Feb. 26, 1996

Related U.S. Application Data

[63] Continuation-in-part of application No. 08/542,010, Oct. 12, 1995, abandoned.

[51] Int. Cl.⁶ .............................. B08B 3/10; H01L 21/00
[52] U.S. Cl. .................................. 156/345; 34/72; 34/84; 34/523; 118/715; 134/1.3; 134/30; 134/102.1; 134/200; 134/902; 438/706; 438/707; 438/714; 438/716; 438/FOR 114
[58] Field of Search .............................. 156/345; 438/706, 438/707, 714, 716, FOR 114; 134/1.3, 902, 102.1, 30, 200; 118/715; 34/523, 72, 84

[56] References Cited

U.S. PATENT DOCUMENTS

| | | | |
|---|---|---|---|
| 3,182,671 | 5/1965 | Vorie | 134/148 |
| 3,341,016 | 9/1967 | Paasche | 210/801 |

(List continued on next page.)

FOREIGN PATENT DOCUMENTS

| | | |
|---|---|---|
| 0058571 | 8/1982 | European Pat. Off. . |
| 0434966 | 7/1991 | European Pat. Off. . |
| 0601532 | 6/1994 | European Pat. Off. . |
| 0605205 | 7/1994 | European Pat. Off. . |
| 0635460 | 1/1995 | European Pat. Off. . |
| 45-40458 | 12/1970 | Japan . |
| 53-10974 | 1/1978 | Japan . |
| 54-161275 | 12/1979 | Japan . |
| 56-88320 | 7/1981 | Japan . |
| 58-19475 | 2/1983 | Japan . |
| 59-166675 | 9/1984 | Japan . |
| 61-148820 | 7/1986 | Japan . |
| 63-176328 | 7/1988 | Japan . |
| 1-204427 | 8/1989 | Japan . |

OTHER PUBLICATIONS

P.A.M. van der Heid et al; "Oxidation of Silicon in Air After Various HF Etches"; 1989; p. 604 No Month.

A. Izumi et al.; "A New Cleaning Method by Using Anhydrous HF/CH₃OH Vapor System"; 1991; pp. 135–137 No Month.

Naruhiko Nakanishi et al.; "Precise Control of SiO₂ Etching Characteristics Using Mono–Layer Adsorption of HF/H₂O Vapor"; Aug. 1995; pp. 255–257.

J. Ruzyllo et al.; "Etching of Thermal Oxides in Low Pressure Anhydrous HF/Ch₃OH Gas Mixture at Elevated Temperature"; Apr. 1993; pp. L64–L66.

Moreau et al., "Wafer Cleaner System", IBM Technical Disclosure Bulletin, vol. 14, No. 10, pp. 2905–2906 (Mar. 1972).

van der Heide, P.A.M., et al., "Etching of Thin SiO₂ Layers Using Wet HF Gas", J. Vac. Sci. Technol., A7(3), pp. 1719–1723. (May/Jun. 1989).

Product Brochure, "Preliminary Product Information–EDGE 2000", Advantage, Production Technology Inc., (1989) No Month.

(List continued on next page.)

*Primary Examiner*—Anthony Green
*Attorney, Agent, or Firm*—Lyon & Lyon LLP

[57] ABSTRACT

Processing methods and systems using vapor phase processing streams made from a liquid phase source and feed gas. Some versions use multiple liquid sources and multiple vapor generators which each produce vapors which are mixed. Some of the vapor generators use metering pumps to inject a controlled flow of liquid into a controlled flow of feed gas. In some embodiments the vapors are exsiccated to reduce saturation before being introduced as a processing chamber vapor mixture into a processing chamber. The semiconductor pieces are preferably rotated within the processing chamber and can be processed in batches.

71 Claims, 7 Drawing Sheets

U.S. PATENT DOCUMENTS

| | | | |
|---|---|---|---|
| 3,489,608 | 1/1970 | Jacobs et al. | 134/25.4 |
| 3,727,620 | 4/1973 | Orr | 134/95.2 |
| 3,773,578 | 11/1973 | Glendinning et al. | 438/706 |
| 3,865,298 | 2/1975 | Allen et al. | 118/63 |
| 3,983,361 | 9/1976 | Wild et al. | 219/433 |
| 4,159,917 | 7/1979 | Gluck | 438/477 |
| 4,264,374 | 4/1981 | Beyer et al. | 134/3 |
| 4,449,885 | 5/1984 | Hertel et al. | 414/750 |
| 4,458,703 | 7/1984 | Inoue et al. | 134/57 R |
| 4,475,259 | 10/1984 | Ishii et al. | 134/64 R |
| 4,529,427 | 7/1985 | French | 65/417 |
| 4,605,479 | 8/1986 | Faith, Jr. | 438/660 |
| 4,628,616 | 12/1986 | Shirai et al. | 134/78 |
| 4,651,440 | 3/1987 | Karl | 34/58 |
| 4,693,777 | 9/1987 | Hazano et al. | 156/345 |
| 4,736,758 | 4/1988 | Kusuhara | 134/66 |
| 4,745,422 | 5/1988 | Matsuoka et al. | 396/571 |
| 4,749,440 | 6/1988 | Blackwood et al. | 438/706 |
| 4,778,559 | 10/1988 | McNeilly | 118/728 |
| 4,788,994 | 12/1988 | Shinbara | 134/157 |
| 4,797,316 | 1/1989 | Hecq et al. | 428/167 |
| 4,804,560 | 2/1989 | Shioya et al. | 438/675 |
| 4,857,142 | 8/1989 | Syverson | 216/79 |
| 4,885,047 | 12/1989 | Ury et al. | 156/345 |
| 4,900,395 | 2/1990 | Syverson et al. | 438/706 |
| 4,924,890 | 5/1990 | Giles et al. | 134/61 |
| 4,944,837 | 7/1990 | Nishikawa et al. | 216/41 |
| 4,977,688 | 12/1990 | Roberson, Jr. et al. | 34/92 |
| 5,022,961 | 6/1991 | Izumi et al. | 438/743 |
| 5,044,314 | 9/1991 | McNeilly | 118/715 |
| 5,078,832 | 1/1992 | Tanaka | 216/94 |
| 5,169,408 | 12/1992 | Biggerstaff et al. | 29/25.01 |
| 5,174,855 | 12/1992 | Tanaka | 216/99 |
| 5,232,328 | 8/1993 | Owczarz et al. | 414/222 |
| 5,232,511 | 8/1993 | Bergman | 134/2 |
| 5,238,500 | 8/1993 | Bergman | 134/3 |
| 5,248,380 | 9/1993 | Tanaka | 216/59 |
| 5,288,333 | 2/1994 | Tanaka et al. | 134/31 |
| 5,336,356 | 8/1994 | Ban et al. | 156/345 |
| 5,357,991 | 10/1994 | Bergman et al. | 134/102.1 |
| 5,370,741 | 12/1994 | Bergman | 134/3 |

OTHER PUBLICATIONS

IBM Technical Disclosure Bulletin vol. 19, No. 7, p. 2574, "Process for Reducing Gold or Copper Wafer Contamination During Oxide Removal" by M. Briska, et al. (Dec. 1976).

Beyer et al., IBM Tech. Disc. Bull., "Etching of $SiO_2$ in Gaseous $HF/H_2O$", vol. 19, No. 7, Dec. 1976, p. 2513.

Burggraaf, Pieter, "Vapor–Phase Cleaning at Reduced Pressure", Semiconductor International, p. 36, (Dec. 1989).

"A Mechanism of Particle Generation and a Method to Suppress Particles in Vapor $HF/H_2O$ System" in Shigeo Onishi, et al., Extended Abstracts of the 22nd (1990 International) Conference on Solid State Devices and Materials, Sendai, 1990, pp. 1127–1130. No Month.

"Upside–Down Resist Coating of Semiconductor Wafers", by IBM Technical Disclosure Bulletin, vol. 32, No. 1, Jun. 1989.

"Reduced Pressure Etching of Thermal Oxides in Anhydrous HF/Alcoholic Gas Mixtures", *J. Electrochem. Soc.*, vol. 142, No. 4, Apr. 1995, pp. 1322–1326.

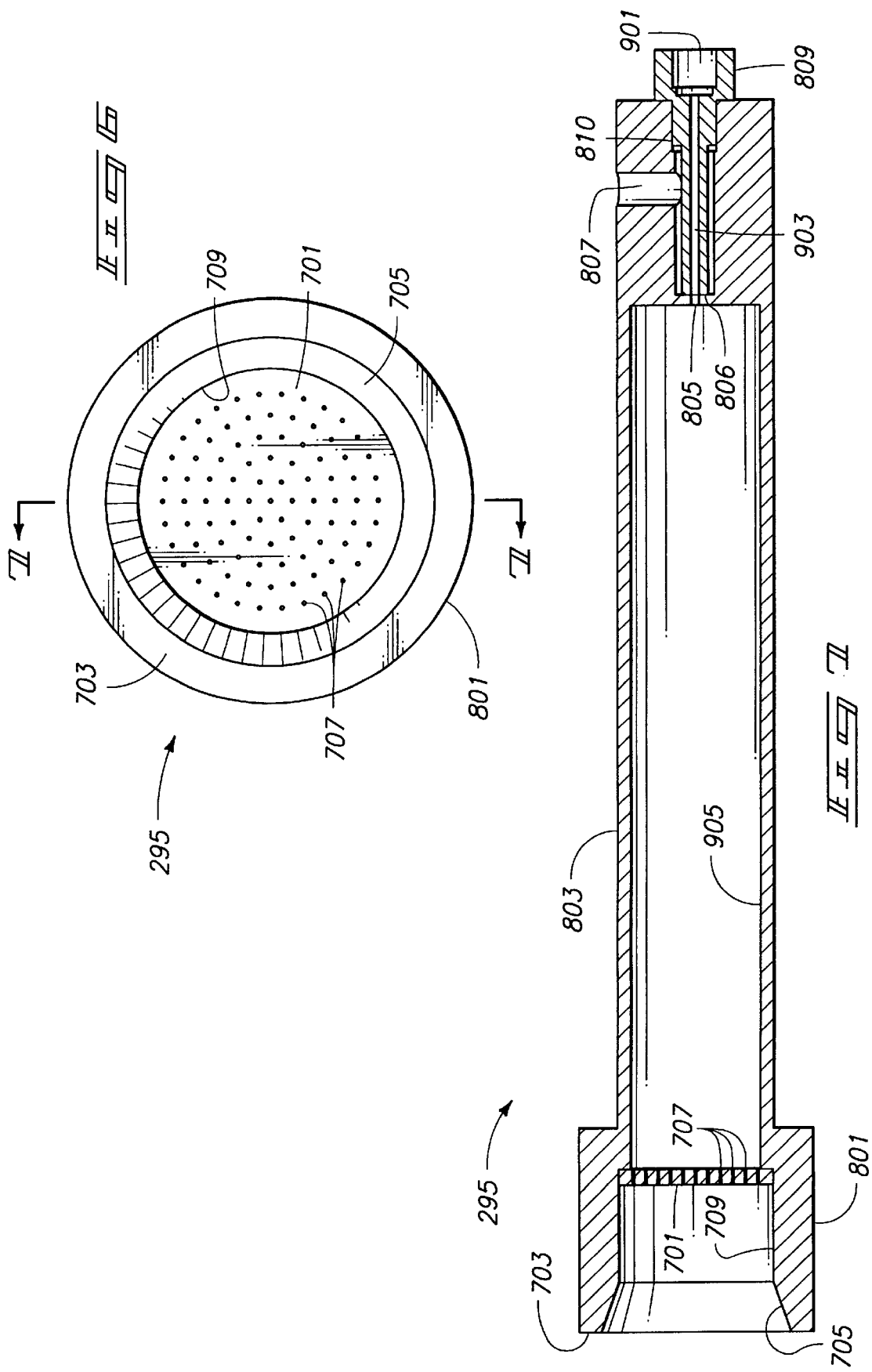

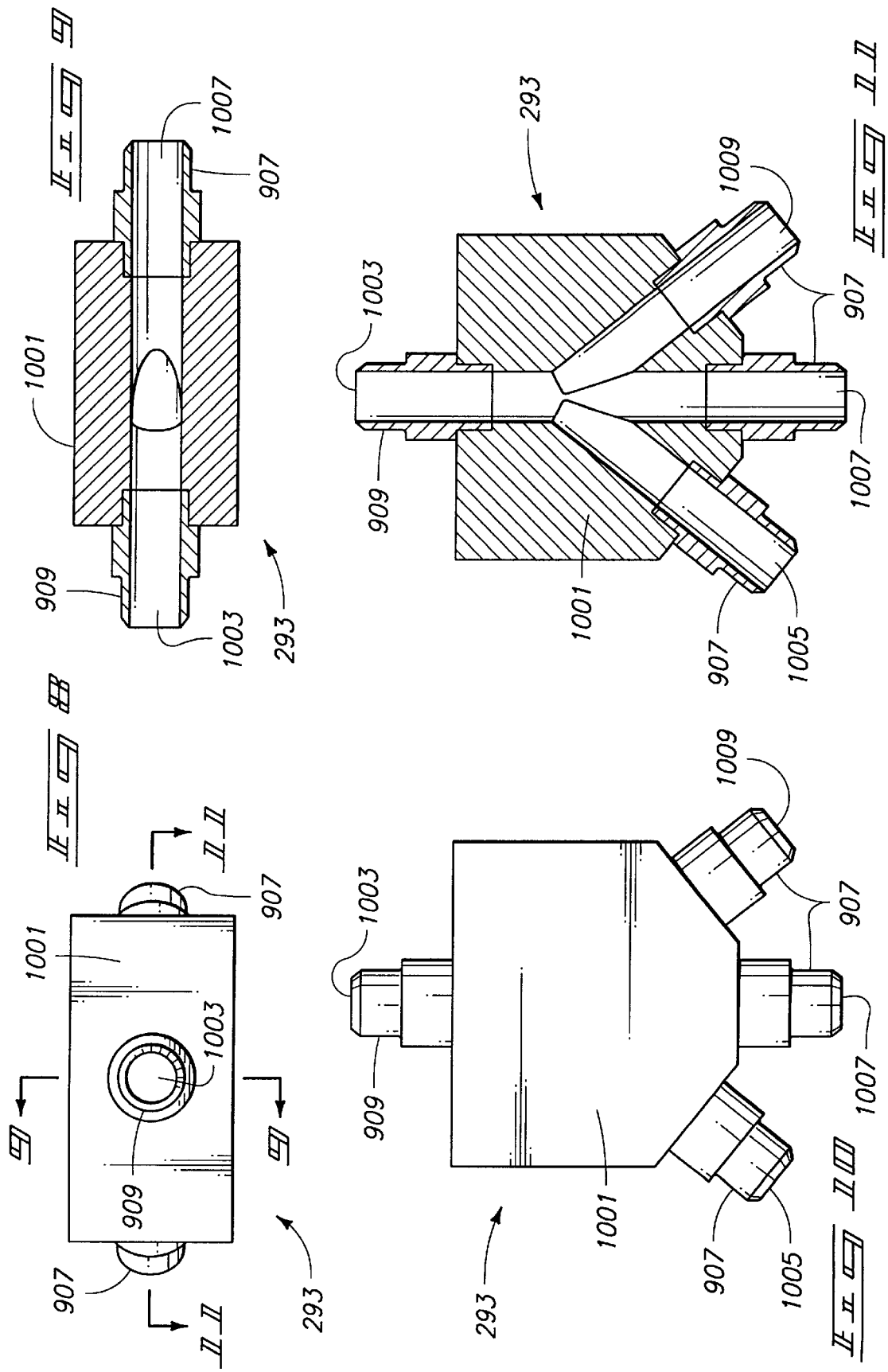

5,954,911

SEMICONDUCTOR PROCESSING USING VAPOR MIXTURES

REFERENCE TO RELATED APPLICATION

This is a continuation-in-part of U.S. patent application Ser. No. 08/542,010 filed Oct. 12, 1995 now abandoned.

TECHNICAL FIELD

The field of this invention is apparatus and processes for treating semiconductor materials using vapor phase mixtures, such as mixtures of aqueous hydrogen fluoride, non-aqueous solvents, and other processing constituents, preferably with an added diluent gas.

BACKGROUND OF THE INVENTION

In the processing of semiconductor wafers and other semiconductor pieces it is typical to perform steps which chemically etch or otherwise remove semiconductor material from the surfaces of the pieces being processed. In the processing of silicon wafers it is common to use an aqueous mixture of hydrogen fluoride to remove silicon and silicon oxide layers. Such aqueous hydrofluoric acid mixtures are effective at performing etches which remove silicon at relatively high etch rates thus speeding processing of the wafers. Vapor phase mixtures of hydrogen fluoride and water have also been used.

In such processing the uniformity of etching is an important consideration which in-part governs the suitability of results associated with a particular process. Processes which otherwise may be conceptually sound will not be commercially viable unless adequate uniformity can be achieved. Uniformity in the etching rates from point to point across the wafer are now preferably on the order of 10 angstroms ($10^{-9}$ meters) or better. To achieve such high degrees of uniformity in etch rates across the wafer is a constant challenge. Even relatively minor variations in processing parameters can have dramatic effects which render the processed semiconductor piece worthless. Such processing is also very sensitive to variations in the repeatability of etch rates between wafers within a batch or between different batches of wafers run using what appears to be the same process and processing parameters. These considerations thus make it extremely difficult to achieve improved processing.

Further complicating the problems of uniformity and repeatability is the desire by most semiconductor device production companies for batch production processes. Batch production processes have the inherent advantage of allowing more throughput per unit of time when conducting the same processing step. However, batch mode processing has the disadvantage that the wafers or other semiconductor pieces are typically held within the processing chamber in a closely spaced parallel processing array configuration. This configuration limits the access of processing fluids to the faces of the wafers which are within the processing array. Thus there are increased challenges with regard to achieving uniformity across the wafer surface because the edges of the disk-shaped wafers are more accessible and the interior areas are less accessible. These factors further complicate the processor's ability to achieve repeatable processing results between different batches because of localized and transitory effects associated with processing multiple batches each containing multiple wafers or other pieces.

Another important consideration in the processing of semiconductor pieces is the need to maintain levels of contamination very low. Even relatively small contaminants of approximately 0.2–0.5 microns can be problematic in the resulting devices being produced. Prior etching technologies for silicon and other semiconductor materials have frequently included one or more hydrogen fluoride processing steps. When a hydrogen fluoride step is performed as a last step in the etching or larger process, this typically results in a hydrophobic silicon surface. Such hydrophobic semiconductor surfaces are more susceptible to contamination, particularly contamination due to particles becoming adhered to the surface of the wafer. In some processing it is mandatory that the silicon surface be cleared of all silicon oxide. This is frequently done using aqueous hydrogen fluoride rinses which render the resulting surface hydrophobic and more susceptible to particle contamination. Thus hydrofluoric acid processing may result in the addition of numerous particles (0.2 micron or larger), such as 100–10,000 particles per wafer.

Thus there has been a longstanding need for hydrofluoric acid and other semiconductor removal processing which has an improved ability to resist contamination, and in particular contamination due to particle additions. Such ability has been needed while also maintaining uniformity and repeatability in the removal rates of the semiconductor materials.

There has also been a long-felt need in the art of semiconductor processing for improved processes and apparatus for providing vapor phase chemical processing. Vapor phase processing can be particularly difficult in some chemistries. In all chemistries there are particular concerns associated with generation of vapor phases of the processing chemicals in such a manner as to achieve vapor phases which are homogeneous. The homogeneity desired is sometimes a matter of achieving homogeneous vapor concentrations of a single constituent. Still more challenging is the difficulty in achieving homogeneous vapor concentrations when there are multiple chemical constituents in additional to air, nitrogen or other underlying gas with which the vapors are mixed or carried.

Vapor phase mixtures also typically vary in relative concentrations of the constituents and in other ways different from liquid mixtures from which the vaporous mixtures are generated. For example, the relative amounts of a mixed constituent chemical system when in the liquid state often are different than when these same constituents are transformed to a vapor phase. These variations further increase the challenges for producing uniform and repeatable processing results.

There remains a need in the semiconductor processing industry for improved methods and apparatus for effecting vapor phase processing in a reliable, repeatable and uniform manner.

BRIEF DESCRIPTION OF THE DRAWINGS

Preferred embodiments of the invention are described below with reference to the accompanying drawings, which are briefly described below.

FIG. 6 is an end elevational view showing the discharge end of the vaporizer shown in FIG. 5.

FIG. 7 is a longitudinal sectional view showing a preferred vaporizer used in the system of FIG. 4. FIG. 7 is taken along section line 7—7 of FIG. 6.

FIG. 8 is a front elevational view showing a preferred vapor mixer used in the system of FIG. 4.

FIG. 9 is a sectional view taken along line 9—9 of FIG. 8.

FIG. 10 is a plan view of the vapor mixer of FIG. 7.

FIG. 11 is a sectional view taken along line 11—11 of FIG. 8.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

First Processing System—Centrifugal Processing Machine Subsystem

Figure 1:
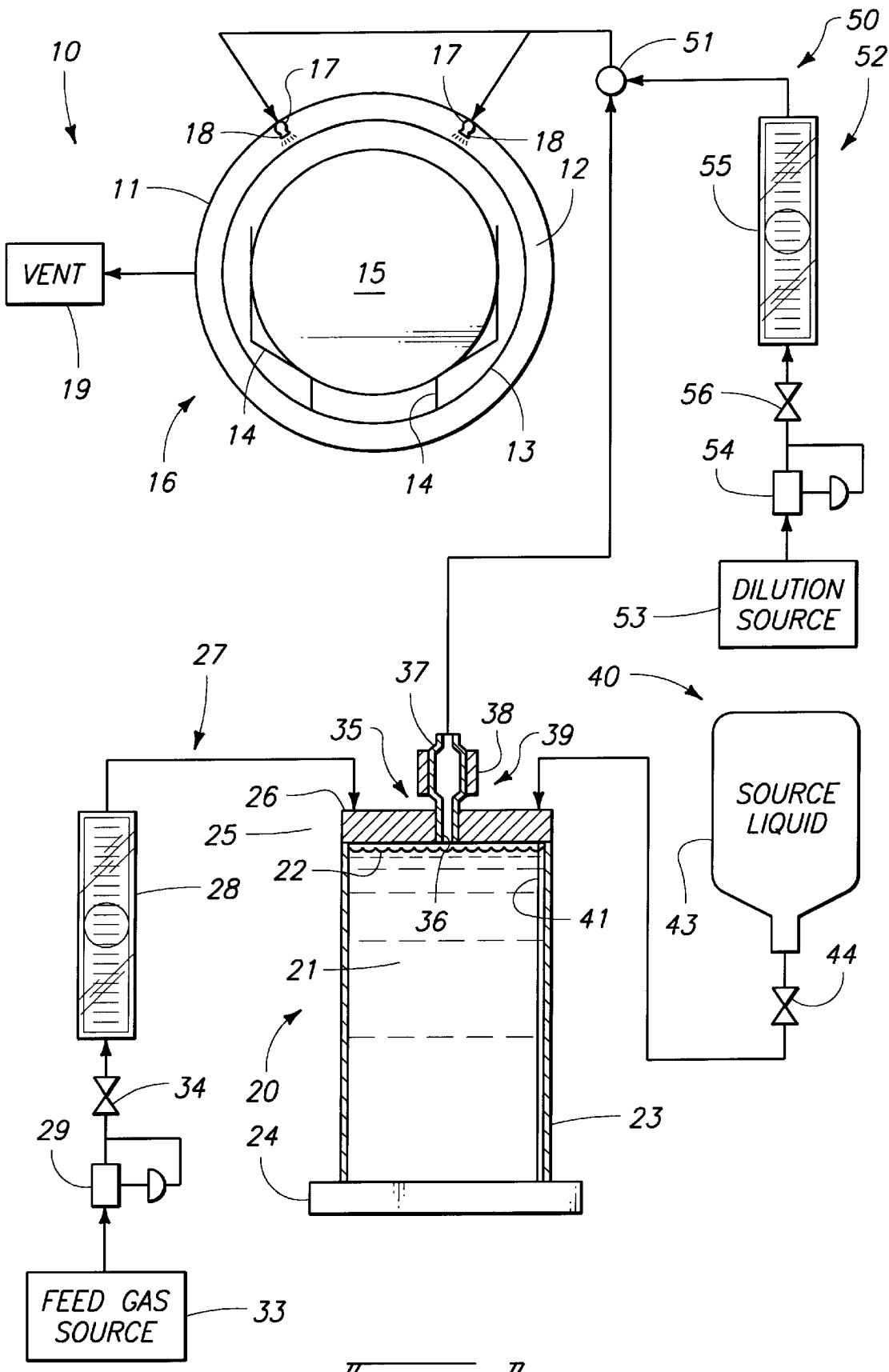
FIG. 1 is a schematic view showing a preferred processing system used in accordance with this invention.

FIG. 1 shows a preferred first processing system 10 according to this invention. System 10 include a processing vessel 11 which is preferably constructed to allow closure using a door (not shown). When closed, the processing vessel forms a substantially enclosed processing chamber 12. The processing vessel preferably encloses portions of a rotor 13. Internal portions of the rotor are mounted for controlled rotation within the processing chamber 12. Rotor 13 preferably has features which hold a wafer carrier 14. Wafer carrier 14 supports one or more wafers or other semiconductor pieces 15 being processed. The rotor and any associated wafer carrier are rotated with the supported wafers or other semiconductor pieces therein. This serves to flow the vaporous mixture held within the processing chamber over the exposed surfaces of the semiconductor pieces and also serves to mix the processing chamber fluids to help maintain uniformity of the fluid mixture and uniformity as to the constituency of the processing mixture as it is presented to the surfaces of the semiconductor piece.

FIG. 1 also shows a pair of processing chamber vapor stream supplies 17. Processing chamber vapor supplies 17 are preferably tubular manifolds or other suitable conduits used to pass and distribute processing fluids to the chamber 12. Preferably, the vapor supplies are a tubular conduit have a plurality of processing chamber supply nozzles 18 which allow processing fluids to be dispensed into chamber 12 at a plurality of nozzle or dispensing positions within the processing chamber. This allows the vapors to be introduced about the surfaces of the wafers or other pieces 15 being processed. A vent 19 can also advantageously be included to allow gas flow into the processing chamber without pressure buildup, to thereby maintain a desired processing chamber operating pressure. Typically the pressure is at or near atmospheric, although reduced and elevated pressures are alternatively possible.

As shown, the processing vessel 11, chamber 12, rotor 13, fluid supplies 17 and associated nozzles 18 are merely shown in a schematic form. A variety of semiconductor centrifugal processing machine subsystems can be used to implement this portion of the greater system 10. Most preferably, the centrifugal processing machine subsystem 16 formed by these components is in the form of a model Semitool Spray Acid Processor manufactured by Semitool, Inc. of Kalispell Mont. 59901. The preferred centrifugal processing machine subsystem utilizes a suitable material for the process being performed. As described, the preferred materials are polymer materials. High density polyethylene, or PTFE TEFLON materials are used to construct the processing vessel and rotor when utilized with hydrogen fluoride processing as specifically described below. Alternative centrifugal processing machines may be suitable for use in system 10.

First Processing System—Vapor Generator

Processing system 10 further includes at least one vapor generator 20. Vapor generator 20 includes a liquid compartment 21 for holding a source liquid 22. The source liquid will be described in greater detail below. The liquid compartment is preferably formed by a vapor generator container 23. Container 23 includes a container base 24. Container 23 is also preferably provided with a container top 25. Top 25 is advantageously constructed in a special configuration so as to serve functions in addition to service as a top to the container. Top 25 and bottom 24 are secured to remaining portions of container 23 by welding or using detachable fasteners (not shown).

Figure 3:
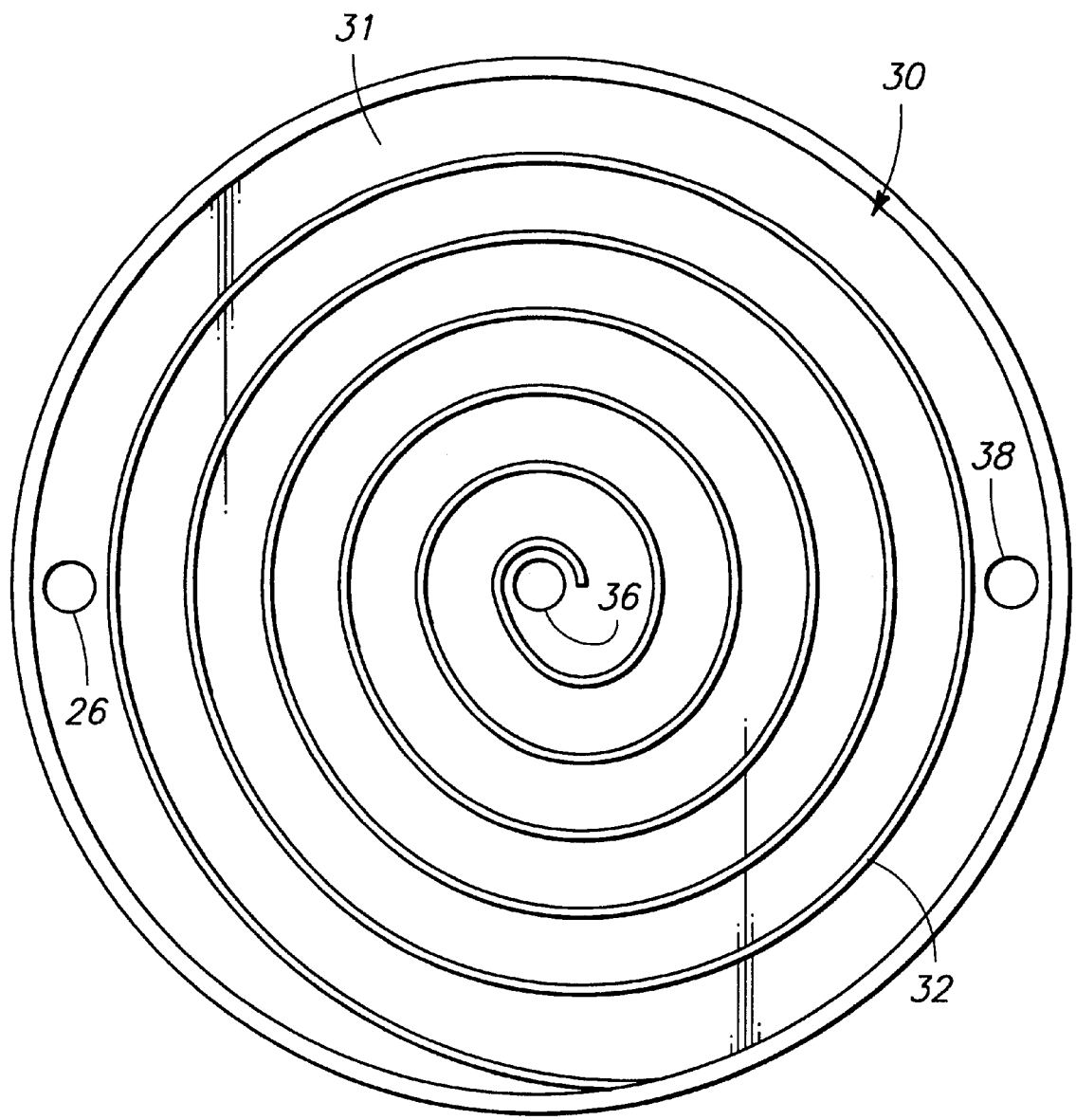
FIG. 3 is a bottom view of the vapor generator top piece used in the processing systems of FIGS. 1 and 2.

FIG. 3 shows a preferred construction for container top 25. Container top 25 includes a feed gas supply port 26 which is connected to a suitable source of vapor generator feed gas (such as described below). Feed gas supply 26 is in fluid communication with a feed gas director 30. As shown, feed gas director 30 is in the form of a spiral groove 31 which is formed along the underside of the container top. The spiral groove is separated by an intervening separation wall 32 which extends from the recessed portions of groove 31 toward the source liquid.

Feed gas enters through feed gas supply port 26 and is conveyed along a tortuous spiral path formed in part by the spiral groove. The tortuous path is also defined by the associated separation wall and source liquid. The source liquid is kept at a suitable elevational level to form a liquid seal with lower portions of the separation wall. Although a spiral groove is shown, other convoluted or tortuous paths can easily be formed either along the underside of the container top, or using another form of baffle, for instance a separate baffle piece mounted within the container to form the feed gas director. The feed gas director directs the flow of feed gas and allows transit against the source liquid 22 for an elongated path. This flow of feed gas against the source liquid is a gas-liquid interaction which results in formation of vapor from the source liquid which is entrained into the feed gas to provide a vapor generator outflow stream.

The supply of feed gas to port 26 is preferably provided by a vapor generator feed gas supply 27. Feed gas supply 27 includes a suitable source of feed gas 33. Suitable sources of feed gas for the preferred chemistries explained below include facilities gas sources for nitrogen, clean dry air, or other gases which are found to not adversely affect processing within processing chamber 12. Alternatively, the source of feed gas can be from tanks or reservoirs (not shown) forming a part of processor 10.

The feed gas from source 33 is preferably passed through a feed gas pressure regulator 29 which regulates the pressure for improved control of the vapor generator. The feed gas from the pressure regulator is passed through a feed gas flow controller 28. As shown, flow controller 28 is in the form of a rotameter which indicate s flow rate of the feed gas into the vapor generator. Flow controller 28 advantageously has an integral feed gas flow control adjustment valve 34 which is shown schematically in FIG. 1. Valve 34 is manually adjusted to provide desired flow rates of the feed gas to the generator and the resulting vapor generator stream from the generator. Alternatively, an automatically controlled feed gas control valve can be used.

Vapor generator 20 also has a vapor generator output 35. In the preferred form, vapor generator output 35 includes a vapor generator outlet port 36 formed through the container top 25. The outlet port is in a central location in fluid communication with the inner end of spiral groove 31. Feed gas flows within the feed gas director spiral groove and exits via port 36. Vapor generator outlet port 36 also serves as a first vapor receiver into which the vapors generated from the source liquid are separated from the liquid.

Vapor generator 20 also preferably includes a source liquid level control 40. Source liquid level control 40 includes a level sensor 41 which is mounted in or adjacent to the liquid compartment 21 to sense the level of the source liquid. Level sensor can be of a variety of types well-known in the art of liquid level detection. The source liquid level control 40 also includes a source liquid make-up port 38 which is advantageously formed through the container top 25. Port 38 is used to supply source liquid from a source liquid reservoir 43. A source liquid make-up control valve 44 controls the flow of source liquid from reservoir 43 to the vapor generator. Valve 44 is controlled using a 41 suitable electrical or pneumatic relay or other controller (not shown) which opens the valve in response to a call for source liquid as sensed by level sensor 41.

FIG. 1 also shows that the preferred vapor generator output 35 also includes a second vapor receiver 37. Vapor receiver 37 is formed to aid in separation of the vapor and liquid phases. It also serves as part of a vapor cooler 38. Vapor cooler 38 can be selected from several possible cooler types, such as a circulating water jacket, thermoelectric, expanding gas, or other suitable types. Vapor cooler 38 and the vapor receiver 37 function as an exsiccator 39 which serves to desaturate excessive amounts of source liquid which may be vaporized depending upon the particular source liquid being used and other operational parameters. Exsiccator 39 eliminates or reduces the risk of possible condensation of liquids from the vapor generator outflow stream emitted from vapor generator outfeed 35.

First Processing System—Dilution Gas Infuser

The processing system 10 also preferably includes a dilution gas infuser 50 for infusing a dilution gas with the vapor generator outflow stream. Dilution gas infuser 50 preferably includes a stream mixer 51. Mixer 51 is connected in fluid communication to receive the vapor generator outflow stream. Mixer 51 is further connected to receive a dilution gas from a dilution gas supply 52. Mixer 51 further is connected in fluid communication with processing chamber vapor supplies 17 to provide a processing chamber vapor mixture stream which is used to process the semiconductor pieces 15. Mixer 51 can be of various mechanical constructions which induce mixing between the streams being mixed. In one form of the invention the mixer is an enlarged tee fitting. Alternatively, it can be constructed to provide cyclonic mixing between the two streams.

Dilution gas supply 52 takes gas from a suitable source of dilution gas 53. Suitable sources of dilution gas for the preferred chemistries explained below include facilities gas sources for nitrogen, clean dry air, or other gases which are found not to adversely affect processing within processing chamber 12. Alternatively, the source of dilution gas can be from tanks or reservoirs (not shown) forming a part of processor 10.

The dilution gas from source 53 is preferably passed through a dilution gas pressure regulator 54 which regulates the pressure for improved control of the infuser. The dilution gas fed from the pressure regulator is passed through a dilution gas flow controller 55. As shown, flow controller 55 is in the form of a rotameter which indicates flow rate of the dilution gas. Flow controller 55 advantageously has an integral dilution gas flow control adjustment valve 56 which is shown schematically in FIG. 1. Valve 56 is manually adjusted to provide desired flow rates of the dilution gas to mixer 51. Alternatively, an automatically controlled dilution gas control valve can be used.

Second Processing System—Generally

Figure 2:
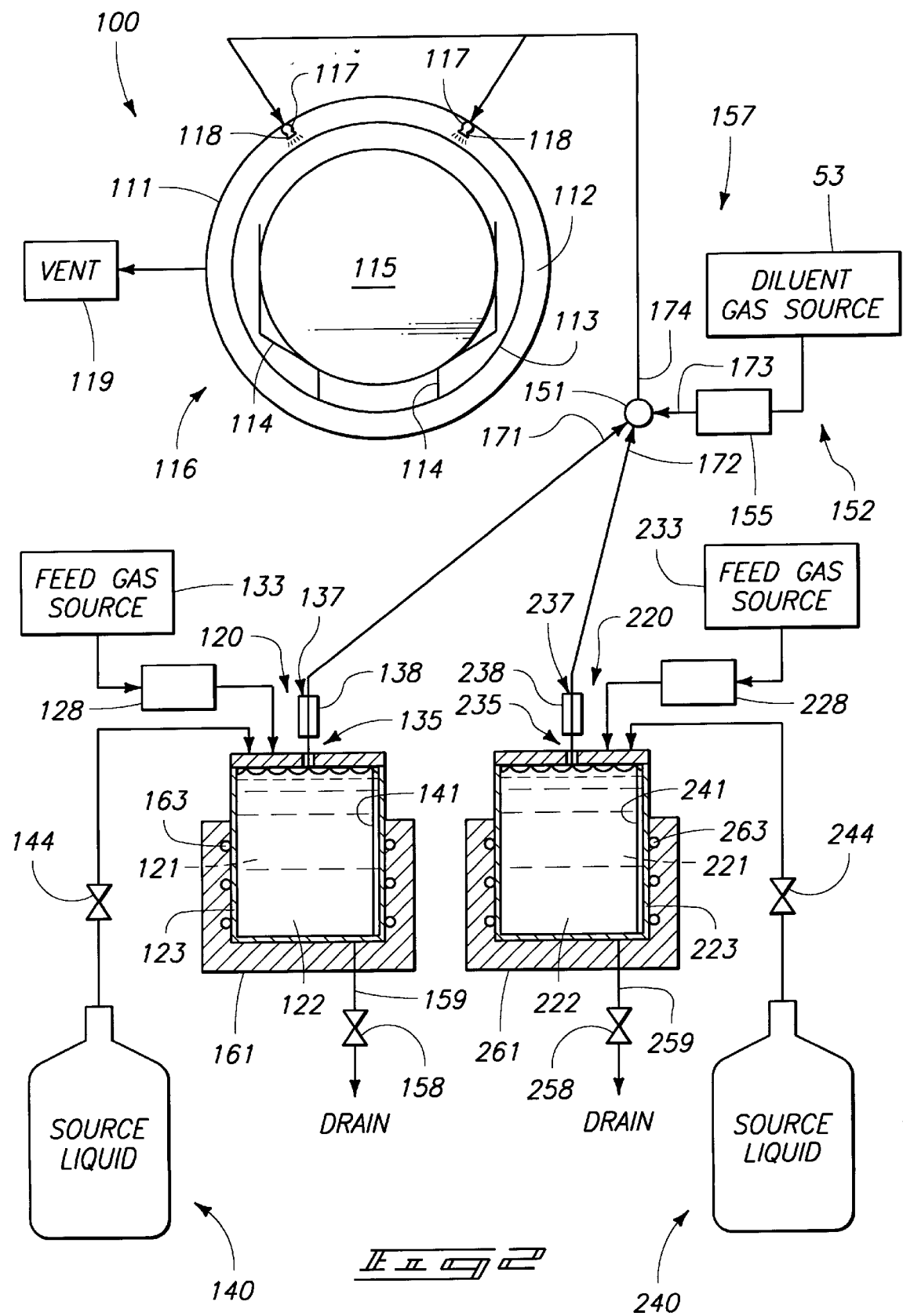
FIG. 2 is a schematic view showing another preferred processing system used in accordance with this invention.

FIG. 2 shows an alternative second processing system 100 according to this invention. System 100 has a centrifugal processing machine subsystem 116 which is the same or similar to subsystem 16 described above. Other components or subsystems described above which are the same or very similar to those described above in connection with system 10 have been numbered similarly with the addition of the "1" in the hundreds column. Components which need varying or additional description will now be considered.

Second Processing System—Multiple Vapor Generators

Processing system 100 differs from processor 10 in having plural vapor generators 120 and 220. A first vapor generator 120 is intended to generate a vapor generator output stream comprised of a first feed gas and a first vapor which is vaporized from a first source liquid 122. A second vapor generator 220 is intended to generate a vapor generator output stream comprised of a second feed gas and a second vapor which is vaporized from a second source liquid 222. These vapor generators are similar with regard to many features as compared to vapor generator 20. Additions have been made in the hundreds column of 1 and 2 for the respective features of generators 120 and 220 which are similar as those described above for vapor generator 20. Additional explanation is given below with regard to differences between generators 120, 220 and vapor generator 20.

Source liquid is supplied to the vapor generator liquid compartments 121 and 221 using a somewhat modified first and second vapor generator feed gas supplies 127 and 227. Each such supply takes feed gas from the respective feed gas sources 133 and 233 and passes the incoming feed gas through mass flow controllers 128 and 228, respectively. The mass flow controllers monitor and govern the flow of feed gas to a preset delivery rate. The first and second feed gases then pass into vapor generators which have internal constructions as described above in connection with vapor generator 20.

Vapor generators 120 and 220 also differ from generator 20 in being constructed with added heating units 161 and 261. Heating units 161 and 261 are preferably thermally insulated and provided with receptacles into which are received portions of the containers 123 and 223. One or more electrical resistance elements 163 and 263 are included along the interior walls of the receptacles allowing heat to be input to the container and source liquid held therein. The operating temperatures of the liquid compartments of the containers are preferably regulated by thermostats (not shown).

Containers 123 and 223 are also advantageously provided with liquid compartment drains 159 and 259, respectively. Drains 159, 259 are preferably provided with drain valves 158 and 258, respectively.

Second Processing System—Stream Mixer

Processing system 100 also differs from processing system 10 with regard to the stream mixer 151. Stream mixer 151 serves not only as the infuser of dilution gas supplied from dilution gas supply 152, but also as a vapor stream mixer. Alternatively, the dilution gas infuser and vapor stream mixer can be separate and distinct parts of the systems. Stream mixer 151 is a fluid conduit and mixing apparatus which as shown has four branches. A first input branch of mixer 151 is the first vapor generator branch 171 which is connected to the output 135 from first vapor generator 120. A second input branch of mixer 151 is the second vapor generator branch 172 which is connected to the output 235 from second vapor generator 220. A third input branch or dilution input branch 173 is connected to receive diluent gas from diluent gas supply 152. The fourth and output branch 174 of mixer 151 is connected to the processing chamber vapor supplies 117.

The diluent gas supply 152 includes a diluent gas source 153 and a mass flow controller 155. Mass flow controller 155 regulates the flow of diluent gas to a preset operating flow rate based upon the mass of material being passed therethrough.

Third Processing System—Processing Vessel

Figure 4:
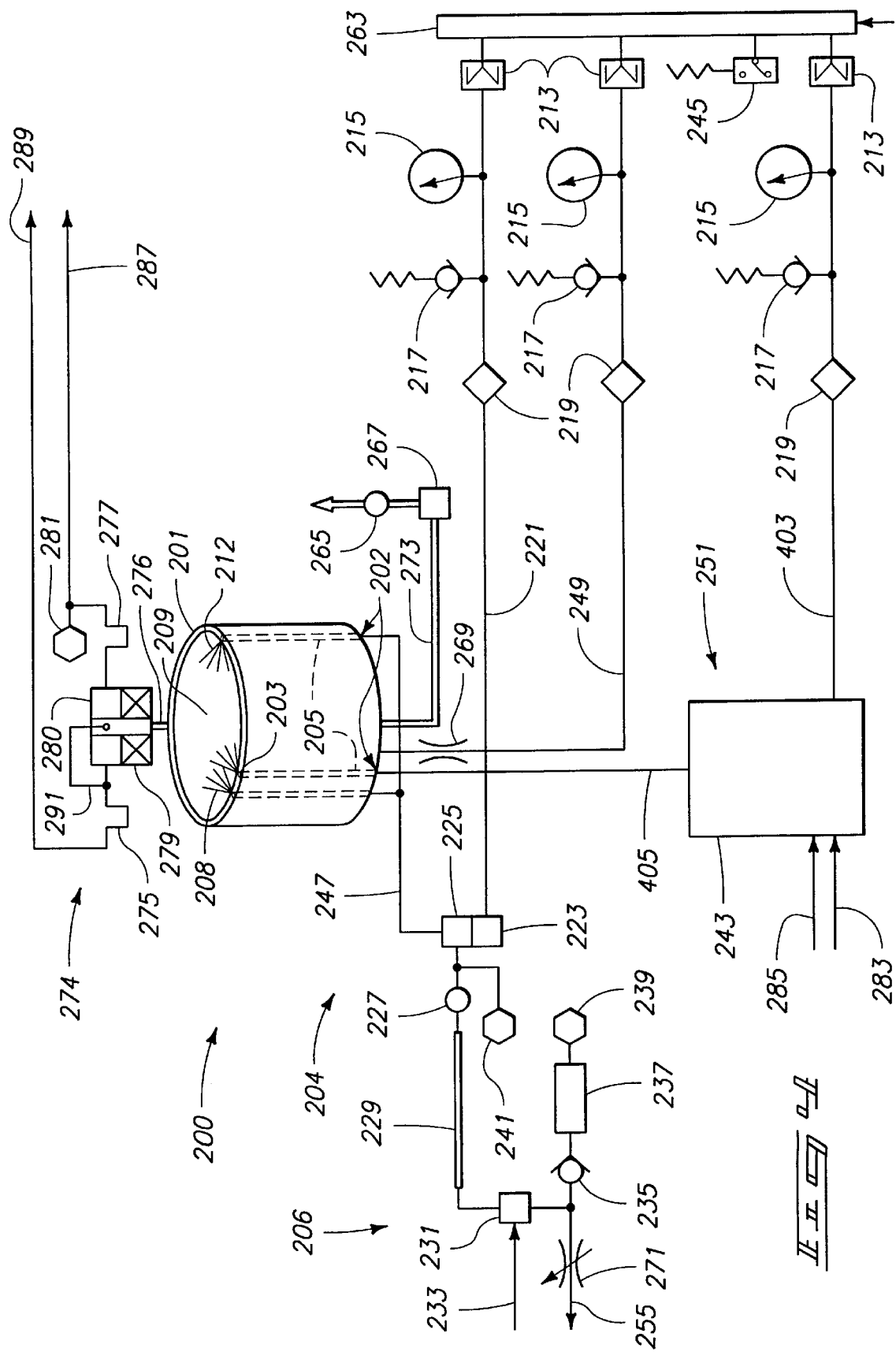
FIG. 4 is a schematic view showing another preferred processing system used in accordance with this invention.

FIG. 4 shows another preferred embodiment of the invention in the form of a processor 200. Processor 200 includes a processing vessel 201 which encloses a processing chamber 209. The processing vessel which can be of various constructions, and preferably includes a controllable front door (not shown) which allows the processing chamber to be closed to thereby form a substantially enclosed processing chamber. In the embodiment shown, processor 200 is a single station or module forming a part of a larger multistation processing system not otherwise shown but sold under the trademark MAGNUM by Semitool of Kalispell, Mont. A large number of other processing vessel and systems configurations are possible for utilization of the inventive systems described herein.

Third Processing System—Processing Chamber Inflows

As shown, processor 200 also includes a plurality of processing chamber fluid supplies 202 which are advantageously in the form of a manifold or manifolds each having a plurality of processing fluid supply nozzles 203. The chamber processing fluid supply nozzles 203 emit processing fluid chamber supply spray jets 212. The particular construction of the fluid supplies, nozzles and their number may vary as processing requirements indicate. Although only one supply manifold is shown in the schematic view of FIG. 4, it is alternatively possible to include a plurality of manifolds each of which can include a plurality of nozzles.

Processing fluids are delivered to the processing chamber fluid supplies 202 from a desired processing fluid or vapor supply subsystem 243. In the preferred construction of FIG. 4, there is a single processing vapor supply which is generally indicated by block 243. The preferred systems according to this invention provide processing fluids in the form of vaporous mixtures of one or more chemicals in combination with a carrier gas. The systems use vaporous mixtures generated from liquid processing chemicals. The liquid processing chemicals are not generally considered to be gaseous at the desired processing pressures and temperatures at which the processing chamber is to be operated. For example, the vaporous mixtures of etchants, water and carrier gases as explained elsewhere in this application. Other chemical combinations are also possible.

Although FIG. 4 only shows a single processing fluid supply 243 which will be described more fully below in a preferred form and construction, it should be appreciated that there can be a plurality of such supplies. Each supply can be connected to a single manifold 205 or be used to supply processing fluids to a number of such manifolds. Alternatively, a number of supplies 243 can be fed to a single or multiple manifolds as the particular system requirements suggest.

The processing system is also preferably provided with a water or other suitable rinse subsystem 204 for rinsing semiconductor pieces being processed and for cleaning and maintenance of the processing vessel 201. Processing vessel 201 further advantageously includes one or more maintenance rinse manifolds 205 each of which has a number of rinse nozzles 208. Manifolds 205 are supplied with deionized water from a deionized water source 206 of conventional design. As shown the washdown or maintenance fluid source 206 includes a facilities deionized water supply 233, and a shutoff valve 231 which is controlled to appropriately pass or shunt deionized water supplied from primary supply 233. The outflow from valve 231 passes via conduit 229 to a deionized washdown flow control valve 225. A flow detecting switch 227 is preferably included upstream of valve 225 for sensing flow of fluid in line 229.

FIG. 4 also shows a deionized water supply recycle subsystem which includes an adjustable valve 271. A secondary source of deionized water 239 is supplied via a filter 237 and check valve 235 to valve 271. When water is not being supplied via valve 231, then the water is preferably recirculated at a lower flow rate via valve 271 to outflow 255. This maintains the deionized water supply with fresh water having minimal amounts of bacterial development.

Control valve 225 is advantageously coupled with a nitrogen purge valve 223 which is controlled to upon command flow nitrogen purge gas through valve 225, the downstream lines, and attached processing chamber fluid supplies 202 to clear them of water. Nitrogen is supplied to valve 223 via line 221 from a nitrogen supply manifold 263.

Third Processing System—Nitrogen Supply

The nitrogen supply manifold 263 supplies nitrogen to supply line 221. The supply branch line 221 also preferably includes a pressure regulator 213, pressure gauge 215, relief valve 217, and filter 219 used to provide clean nitrogen of desired pressure. Similar components are also used on nitrogen supply lines 249 and 403. Nitrogen supply line 403 services processing fluid supply subsystem 243 and will be explained more fully below.

Nitrogen supply line 249 provides a small flow of nitrogen to the processing chamber as restricted by flow control orifice 269. Part of the flow via line 249 is used to gently purge the processing chamber with nitrogen to remove moisture and maintain the chamber in a state of low contamination. Another part of the flow via line 249 goes to a static electricity suppressor (not shown) to dissipate gas having a different electrical charge than the electrical charge of gas which otherwise is supplied to the processing chamber. A controlled pressure relief valve 245 is used to relieve manifold 263 of pressure when operational parameters require such.

Third Processing System—Processing Chamber Outflows

FIG. 4 further shows that processing chamber 209 has a gas outflow or exhaust line 273. The flow of exhaust gas from the processing chamber is controlled by an exhaust control valve 267. The outflow of valve 267 is connected to a facilities exhaust line 265. The facilities exhaust line is preferably operated at a vacuum to remove gas from the processing chamber.

The processing chamber also has liquids outflow subsystem 274. The liquids outflow subsystem 274 includes a drain fitting 276 which is shown schematically. The drain fitting allows liquids to drain from the processing chamber. Flow of draining liquids is controlled by a processing chamber drain flow control. As shown, the drain flow control includes first drain control valve 279 and second drain control valve 280.

The first drain control valve 279 controls the flow of draining liquids to direct them into a suitable first drain line 289, such as an industrial waste drain line provided by the production facility. A gas trap 275 and overflow shunt line 291 are advantageously included between the valve 279 and downstream portions of first drain line 289.

Liquids outflow subsystem 274 also includes the ability to controllably direct outflowing liquids to a second drain line 287 using second drain control valve 280. Second drain line 287 can advantageously be a specialty chemical drain line, such as a drain line capable of handling hydrogen fluoride aqueous mixtures, which are extremely corrosive to many materials. The second drain line is also preferably fitted with a gas trap 277 and a flow sensor 281.

Third Processing System—Vapor Generation & Mixing

Figure 5:
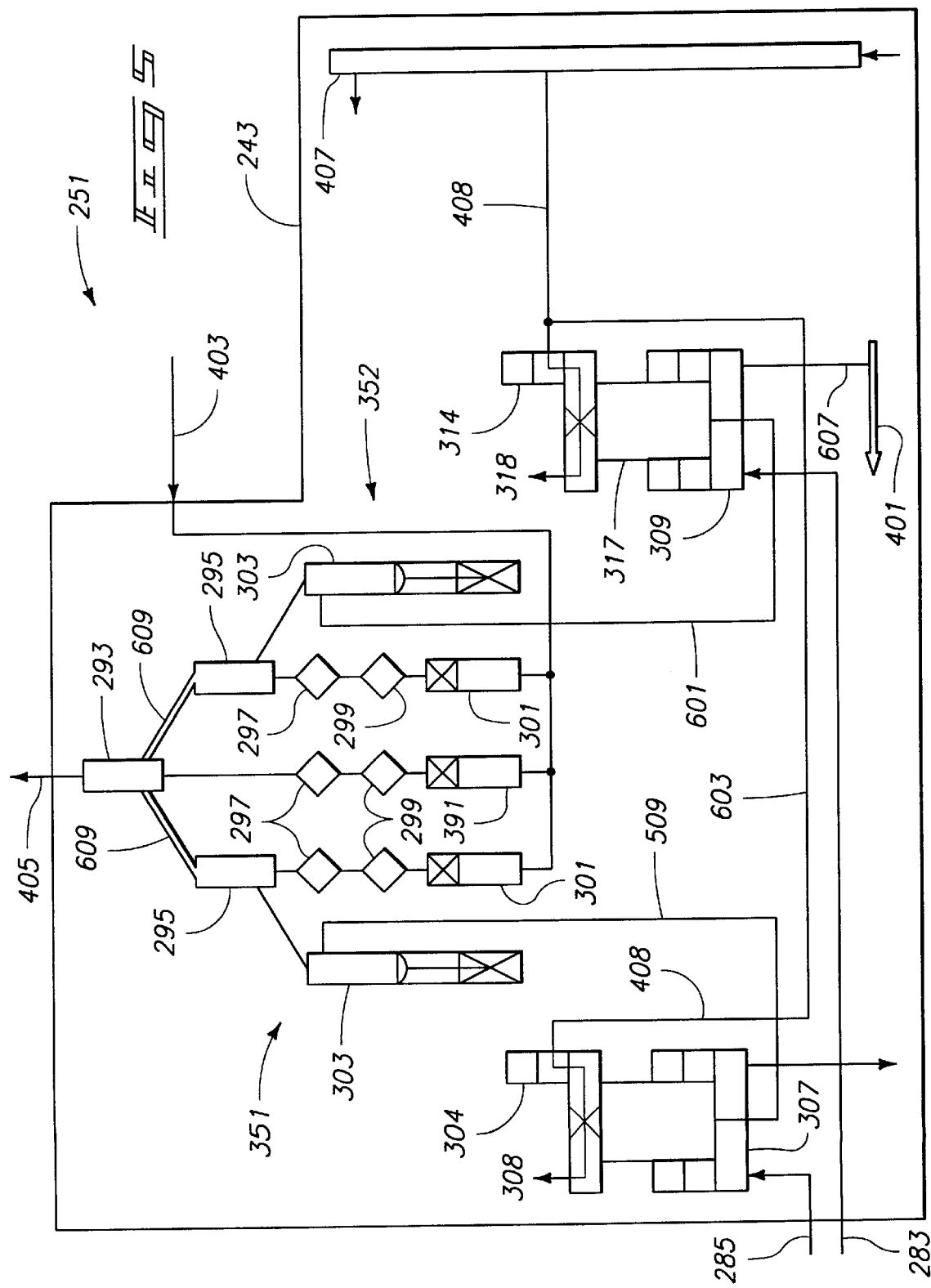
FIG. 5 is a continuation of the schematic view of FIG. 4 which portrays portions of the system which depicted in FIG. 4 by block 243.

FIG. 5 shows a preferred vapor generation and mixing subsystem 243 in detail. Subsystem 243 was simply shown in FIG. 4 with a first processing chemical source supply line 285 and a second processing chemical source supply line 283. First source supply line 285 supplies a first processing chemical, such as an etchant mixture of HF and water, as described elsewhere herein. Second source supply line 283 supplies a second processing chemical, such as isopropyl alcohol or other appropriate solvent or diluent liquid. Although only two source liquids are indicated in the embodiment of FIG. 5, it is alternatively possible to have a single liquid or more than two liquids.

The first liquid chemical source supply line 285 is connected to deliver chemical to a first reservoir or storage container 307. Reservoir 307 can have various features and constructions, such as described elsewhere herein in connection with other embodiments of this invention FIG. 5 also shows a second reservoir or storage container 317 which receives chemical from line 283 and is used to store the second processing liquid.

First and second reservoirs 307 and 317 have associated reservoir outflow lines 509 and 601, respectively. These first and second reservoir outflow lines serve as first and second liquid chemical supply lines which supply processing liquids to a first and second vapor generators 351 and 352 which will be described more fully below.

Reservoirs 307 and 317 are advantageously supplied with small purge or vent flows from a clean dry air or other suitable gas manifold 407 via reservoir purge supply line 408. The vapors from above liquids contained in the reservoirs are vented in an appropriate manner, such as to a facilities exhaust at vents 308 and 318. The flow of purge gas through the upper portions of the reservoirs is preferably controlled using reservoir vent control valves 304 and 314.

First and second vapor generators 351 and 352 each include a metering syringe pump 303. The metering syringe pumps provide accurate delivery of processing liquids to first and second vaporizers 295. The preferred construction of vaporizers 295 is illustrated in FIGS. 6 and 7, and will be described in greater detail below. The vaporizers produce vaporous mixtures of the processing liquids with suitable carrier gas or gases, such as nitrogen.

In the preferred system of FIG. 5, nitrogen is delivered to first and second vaporizer feed gas controllers 301 which are advantageously mass flow rate controllers which sense mass flow rates and suitable valve or otherwise control to achieve a desired feed gas flow rate therethrough. The controlled flow of feed gas passes through electrically controlled and powered heaters 299 which provide heat and increased temperatures to the feed gases. The feed gas supply lines can further be fitted with filters 297 which are ultra-small pore size filters, such as less than 0.003 micron size.

Reference should be made to FIGS. 6 and 7 which show the preferred construction of vaporizers 295. The vaporizers include a tubular body piece 803. Body piece 803 has a vaporization chamber 905 defined therein. The vaporization chamber 905 is screened from an vaporizer outflow chamber 709 using a vaporizer diffuser screen 701. Diffuser 701 includes a plurality of small diffuser vapor passages 707 which selectively pass vaporized processing chemicals and feed gas, but serve to help retain any small droplets of liquid processing chemicals present in the vaporization chamber 905. The outflow chambers 709 are connected to vaporizer outflow lines 609 (FIG. 5) which pass the vapor mixtures to a mixer 293, which will be described in greater detail below.

FIG. 7 also shows the preferred construction of the feed gas and processing liquid combining vaporizer jet 805. The vaporizer jet 805 includes an annular liquid jet passage 806 through which processing liquids are drawn by venturi action. Feed gas is supplied through vaporizer jet feed gas passageway 903. The size of the annular liquid jet passage is adjustable by screwing the jet spool 809 inwardly or outwardly relative to the jet receptacle 810 formed in the end of body piece 803. Processing liquids are supplied though vaporizer liquid inflow port 807. Inflow port 807 is in fluid communication with annular passage 806.

The vapor generator outflow streams from vaporizers 295 via lines 609 to a combined vapor mixer and diluter 293. Vapor mixer 293 is shown in detail by FIGS. 8–11. It includes a mixer body piece 1001 which has a first vapor generator stream input 1005, a second vapor generator stream input 1009, and a diluent gas input 1007. Diluent gas is supplied via a diluent gas mixer mass flow controller 391. These inputs can advantageously be accomplished with threaded fittings 907. Mixer 293 also has an outflow port 1003 with associated fitting 909.

The inside of mixer body 1001 is provided with three convergent input passages adjacent to ports 1005, 1007, 1009. These preferably converge at convergence angles of less than 60° of arc between each other. The preferred construction shows the vapor mixtures are advantageously fed into the diluent gas line which is directly aligned with the outlet port 1003. The angle of convergence between the vapor mixture passages and the diluent gas passage is preferably less than 60° of arc and each is preferably at a similar convergence angle.

The outflow port 1003 is connected to processing chamber mixture feed line 405 which is connected to supplies 202.

Preferred Processing Methods

The invention includes methods for processing semiconductor pieces to remove material therefrom. The methods include preparing a suitable liquid source material from which vapors are to be generated. The preferred source liquid can be in the form of a single source is liquid containing a mixture, or multiple liquids can be used, each containing the same or dissimilar source liquid constituents. In the preferred version described in connection with FIG. 1, the liquid source 22 is comprised of a mixture of aqueous hydrogen fluoride and isopropyl alcohol. The aqueous hydrogen fluoride etchant component of the liquid source mixture can advantageously be provided as an azeotropic mixture. Although a range of percentages are reported in the literature as being azeotropic, it appears that the azeotropic mixture of hydrogen fluoride and water is approximately in the range of 35 to 39% by volume. This azeotropic mixture of water and hydrogen fluoride is combined on a volumetric basis in ratio with the organic solvent preferably used in the methods according to this invention. The ratio of the etchant component is preferably in relative proportion to the organic solvent component in the range of approximately 1:3 to 3:1, even more preferably 1:2 to 2:1, ratios by volume. The specific ratios are dependent upon the type of etchant and organic solvent which are being mixed.

Alternatively, the etchant and organic solvent can be provided as separate source liquids from which vapors are individually generated. This configuration is shown in the embodiment of FIG. 2. In such embodiment, the first or etchant liquid source is preferably azeotropic aqueous hydrogen fluoride. Alternatively, other mixtures of hydrogen fluoride and water can advantageously be used. Preferred relative constituents of water and hydrogen fluoride are in the range of 10%–70% hydrogen fluoride as a percent by volume of total etchant source liquid. The aqueous hydrogen fluoride source liquid is semiconductor grade having very high purity.

The source liquid used in container 220 is preferably the organic solvent which can be used either in full strength or diluted with some additional solvent or additive. The organic solvent source material is preferably made from an alcohol which is more preferably an aliphatic alcohol. More particularly, the aliphatic alcohol is advantageously selected from the group consisting of methanol, ethanol, isopropyl alcohol, butanol, n-propanol. Even more preferably, the methods are practiced using isopropyl alcohol. In the preferred processing the second vapor generator container is used to store isopropyl alcohol without significant additives or diluents. The isopropyl alcohol is preferably semiconductor grade with extremely high degrees of purity.

Processes according to this invention also preferably include generating at least one vapor generator outflow stream from at least one vapor generator using a generator feed gas and at least one source liquid. The generating can in some forms of the invention be even more preferably done by using plural vapor generators such as shown in FIG. 2. Such generating can be done using first and second source liquids which are preferably a first or etchant source liquid, and a second organic solvent source liquid. Alternatively, other numbers of vapor generators can be used with one or more associated source liquids which can be similar or dissimilar in their constituent make-up.

Methods according to this invention further include supplying at least one carrier gas which is used in the generating of the vapor generator outflow stream or streams. The supplying of feed or carrier gas to the vapor generators is preferably done in a controlled manner, such as by controlling the operation of valve 34 to provide a desired feed gas flow rate as indicated by rotameter 28. The supplying of feed gas to the vapor generator can further advantageously include regulating the pressure of feed gas prior to supplying the feed gas to the vapor generator.

Methods according to the invention further preferably include directing the feed gas against source liquid held in the vapor generator This directing step is performed in a manner which provides for interaction between the feed gas and the liquid. Such interaction is advantageously accomplished by directing the flow of feed gas across the surface of the source liquid along a tortuous path which induces good vapor formation.

The processes according to this invention can further include controllably regulating the level of source liquid within the vapor generator to achieve a desired liquid source level therein. This regulating step in particular is advantageous when the vapor generator utilizes a feed gas director, such as feed gas director 30. Feed gas director 30 partially defines a flow path adjacent the top surface of the fluid which is elongated relative to the available fluid surface area, such as by using the tortuous spiral flow path described above or other convoluted flow path configurations.

The generating step can also preferably be practiced by heating the vapor generator or plural vapor generators, such as by using heating units 161 and 261. Desired temperature ranges will typically be 10–200° C., more preferably 20–100° C. The specific range will vary dependent on the source liquid.

Preferred methods according to this invention still further include exsiccating one or more of the vapor generator outflow streams to reduce the degree of saturation existing in the stream due to vaporization. The exsiccating step is advantageously accomplished by passing the exiting vapor generator outflow stream into a receiver and then performing a cooling step upon the outflow stream. This cooling step performs a condensing function which removes vaporous source liquid from the outflow stream to the extent desired. It also achieves the desired degree of saturation for the vapor mixture coming from the generators.

Methods according to this invention further preferably include diluting at least one vapor generator outflow stream using a dilution gas, such as supplied by dilution gas infuser 50. The dilution gases are selected from gases the same or similar to those indicated for the feed gases. The degree of dilution which occurs is preferably controlled by controlling the relative amounts of dilution gas being fed with respect to the vapor generator outflow stream or streams being diluted. The diluting step can also be enhanced by regulating the pressure of gas being supplied as the diluent gas. The diluting step also preferably includes measuring the flow rate of the diluent gas being supplied during the diluting step.

Novel methods according to the invention also preferably include mixing a plurality of streams to provide a generally homogeneous gas and vapor mixture. The mixing is preferably done prior to introducing the stream into the processing chamber at nozzles 17. The mixed stream is utilized as the processing chamber vapor mixture supplied to the processing chambers, such as processing chambers 12 and 112. The mixing step can be performed using one or more stages. For example, by mixing two vapor streams and then in turn mixing the resulting stream with a further stream. Mixing can be performed using multiple vapor streams outflowing from multiple vapor generators such as vapor generators 120 and 220, or more generators. The mixing of plural vapor streams can be coincidental with mixing with a diluent gas source or diluent gas can be done stage-wise, as is most desired. In the preferred embodiment described in connection with FIG. 2, the system simultaneously mixes vapor generator outflow streams from two vapor generators while adding diluent gas from the diluent gas supply.

The mixture of vapor streams can be done in various proportions as are found desirable for the particular chemicals and processing requirements which apply. In the preferred chemistries of silicon wafers, HF, water, and isopropyl alcohol; vapor flow rates of 1–100 liters per minute (lps) are typical. The delivery flow rate of processing vapor stream to the processing chamber will vary depending upon the volume of the processing chamber, the number of wafers or other pieces being processed, and other parameters of the system. Relative flow rates of 1:10 to 10:1 aqueous hydrogen fluoride: alcohol are preferably used; more preferably, relative flow rates of 1:4 to 4:1 are used; even more preferably relative flow rates of 1:2 to 2:1 are used.

Methods according to the invention further include supplying a processing chamber stream or vapor mixture to the processing chambers. This supplying action is preferably performed while the processing chamber is in a substantially closed condition.

The processing methods can further include venting the processing chamber to allow inflow of the processing chamber stream without pressurizing the processing chamber This is advantageously done by utilizing vents 19 and 119.

The methods according to this invention also preferably include rotating the semiconductor wafers or other pieces being processed within the processing chamber. This is advantageously done by turning rotor 13 and supported wafers 15 while simultaneously supplying the processing chamber stream, such as via chamber nozzles 18. The rotating step preferably is performed at rotational speeds in the range of approximately 10–1,000 revolutions per minute (rpm). More preferably, the processing occurs at rotational speeds in the range of 100–500 rpm.

The processing further preferably includes directing the processing stream from a plurality of nozzles at a plurality of points within the processing chamber which provide enhanced vapor delivery uniformity within the processing chamber.

The processes according to this invention further include processing the semiconductor pieces for a sufficient amount of time to effect the desired amount of etching or other semiconductor removal. Typical processing times are in the range of approximately 1–100 minutes; more preferably 2–60 minutes.

EXAMPLE 1

Processing occurred in a processing system similar to that described in FIG. 1. A centrifugal semiconductor processor was used to hold the wafers and form an enclosed processing chamber. The processor was designed for processing with hydrogen fluoride aqueous mixtures. A vapor generator was charged with a mixture of a) aqueous hydrogen fluoride (49% HF, 51% water, by volume); and b) isopropyl alcohol; in a ratio of 1:1. Nitrogen gas was used as the vapor generator feed gas at a supply rate of 20 liters per minute (lpm) at pressure of 10 pounds per square inch gauge pressure (psig). The feed gas was blown across the surface of the liquid source under a feed gas director similar to that shown in FIG. 3.

Dilution was further provided by mixing into the vapor generator output mixture approximately 15 lpm of additional nitrogen gas. The dilution gas was supplied under a pressure of approximately 10 psig.

The processor rotor was rotated at a rotation rate of 400 rpm for 3 minutes 0 seconds. Silicon wafers were processed as described and the processing resulted in average oxide removal of 67 angstroms (Å). The removal rate was approximately 22Å per minute. Particles were measured before and after the processing using an ESTEK CR-80 particle measurement system which measured particle larger than or equal to 0.2 micron in diameter. Pre-processing particle counts were 18, while post-processing counts were 27. This provided an average addition of 9 particles per wafer. Particles of 0.2 micron or larger size were counted,

EXAMPLE 2

Processing occurred in a processing system similar to that described in FIG. 2. The first vapor generator was charged with a azeotropic aqueous hydrogen fluoride (38.4% HF, otherwise water, by volume). The second vapor generator was charged with isopropyl alcohol. Nitrogen gas was used as the vapor generator feed gases. The supply rate to the first vapor generator was 20 liters per minute. The supply rate to the second vapor generator was 10 lpm. Both were supplied at a pressure of 10 psig. The feed gas was blown across the surface of the liquid source under a feed gas director similar to that shown in FIG. 3.

Dilution gas was additionally provided by mixing it with the vapor generator output streams at the rate of approximately 10 lpm of additional nitrogen gas. The dilution gas was supplied under a pressure of approximately 10 psig.

The processor rotor was rotated at a rotation rate of 300 rpm for 3 minutes 0 seconds. Silicon wafers were processed as described and the processing resulted in average oxide removal of 98 Å. Removal rate was approximately 33 Å per minute. Particles were measured before and after the processing using an ESTEK CR-80 particle measurement system which measured particles larger than or equal to 0.2 micron in diameter. Pre-processing particle counts averaged 46, while post-processing counts averaged 54. This provided an average addition of 8 particles per wafer.

EXAMPLE 3

Processing occurred in a processing system similar to that described in FIG. 2. The first vapor generator was charged with a azeotropic aqueous hydrogen fluoride (38.4% HF, otherwise water, by volume). The second vapor generator was charged with isopropyl alcohol. The supply rate to the first vapor generator was 25 lpm. The supply rate to the second vapor generator was zero lpm. The isopropyl alcohol was not used to demonstrate the benefits of using the solvent in the preferred processes of this invention. Processing was otherwise similar to Example 2.

Dilution gas was provided by mixing additional nitrogen gas with the vapor generator output stream at the rate of approximately 20 lpm of nitrogen. The dilution gas was supplied under a pressure of approximately 10 psig.

The processor rotor was rotated at a rotation rate of 300 rpm for 3 minutes 0 seconds. Silicon wafers were processed as described and the processing resulted in average oxide removal of 143 Å. Removal rate was approximately 46 Å per minute. Particles were measured before and after the processing using an ESTEK CR-80 particle measurement system which measured particle larger than or equal to 0.2 micron in diameter. Pre-processing particle counts averaged 37, while post-processing counts averaged 2364. This provided an average addition of 2327 particles per wafer.

This indicates the surprising benefit of the preferred processing using the organic solvent vapors in combination with the etchant vapors.

EXAMPLE 4

Processing occurred in a processing system similar to that described in FIG. 2. The first vapor generator was charged with a azeotropic aqueous hydrogen fluoride (38.4% HF, otherwise water, by volume). The second vapor generator was charged with isopropyl alcohol. Nitrogen gas was used as the vapor generator feed gases. The supply rate to the first vapor generator was 20 lpm. The supply rate to the second vapor generator was 20 lpm. Both were supplied at a pressure of 10 pounds psig. The feed gas was blown across the surface of the liquid source under a feed gas director similar to that shown in FIG. 3.

Dilution gas was additionally provided by mixing it with the vapor generator output streams at the rate of approximately 25 lpm of additional nitrogen gas. The dilution gas was supplied under a pressure of approximately 10 psig.

The processor rotor was rotated at a rotation rate of 50 rpm for 60 minutes 0 seconds. Silicon wafers were processed as described and the processing resulted in average oxide removal of 482 Å. Removal rate was approximately 8 Å per minute. Particles were measured before and after the processing using an ESTEK CR-80 particle measurement system which measured particle larger than or equal to 0.2 micron in diameter. Pre-processing particle counts averaged 6, while post-processing counts averaged 21. This provided an average addition of 15 particles per wafer.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A processing system for treatment of semiconductor pieces with a vaporous mixture, comprising:
    a processing vessel which substantially defines a processing chamber;
    at least one liquid source for providing a source liquid used in producing the vaporous mixture;
    at least one vapor generator; said at least one vapor generator having:
        a vapor generator evaporation chamber;
        a source liquid metering supply for supplying a metered amount of source liquid from the at least one liquid source to the evaporation chamber;
        a vapor generator feed gas supply through which a controlled amount of at least one feed gas is supplied to the vapor generator for mixing in the evaporation chamber;
    a plurality of processing chamber vapor supplies in fluid communication with at least one vapor generator to receive at least one vapor generator outflow stream therefrom; the plurality of processing chamber vapor supplies serving to supply a processing chamber vapor mixture to the processing chamber at a plurality of nozzle positions.

2. A processing system according to claim 1 and wherein the source liquid metering supply includes a metering pump.

3. A processing system according to claim 1 and wherein the source liquid metering supply includes a metering pump which is a positive displacement metering pump.

4. A processing system according to claim 1 and wherein the source liquid metering supply includes a metering pump which is a positive displacement metering pump with sensed control of the amount of fluid actually displaced from the metering pump.

5. A processing system according to claim 1 and further characterized by at least one diluent gas supply connected to mix with the processing chamber vapor mixture supplied to the processing chamber.

6. A processing system according to claim 1 and further characterized by at least one vapor mixer in fluid communication with the at least one vapor generator, for mixing the at least one vapor generator outflow stream with another constituent to produce the processing chamber vapor mixture supplied to the at least one processing chamber vapor supply.

7. A processing system according to claim 1 and further characterized by:
    a plurality of vapor generators;
    at least one vapor mixer in fluid communication with the plurality of vapor generators to receive a plurality of vapor generator outflow streams therefrom, for mixing the plurality of vapor generator outflow streams to produce the processing chamber vapor mixture.

8. A processing system according to claim 1 and further characterized by:
    a plurality of vapor generators;
    at least one vapor mixer in fluid communication with the plurality of vapor generators to receive a plurality of vapor generator outflow streams therefrom, for mixing the plurality of vapor generator outflow streams to produce the processing chamber vapor mixture;
    at least one diluent gas supply connected to mix with the processing chamber vapor mixture supplied to the processing chamber.

9. A processing system according to claim 1 and further characterized in that there are a plurality of vapor generators.

10. A processing system according to claim 1 and further characterized in that there are a plurality of vapor generators, at least two of the vapor generators being adapted to generate vapor generator outflow streams which are formed using plural source liquids which have differing chemical constituencies.

11. A processing system according to claim 1 and further characterized by at least one heater which provides heat to at least one component of the processing chamber vapor mixture.

12. A processing system according to claim 1 and further characterized by at least one heater for heating gas which passes to the processing chamber via at least one vapor generator.

13. A processing system according to claim 1 and further characterized by at least one heater for heating feed gas which passes to the processing chamber via at least one vapor generator.

14. A processing system according to claim 1 and further characterized by at least one rotor at least portions of which are mounted within the processing vessel for rotating an array of semiconductor pieces therewithin and for agitating the processing chamber vapor mixture supplied to the processing chamber when said at least one rotor is in a rotational mode of operation.

15. A processing system according to claim 1 and further characterized by at least one rotor at least portions of which are mounted within the processing vessel for rotating at least one semiconductor piece therewithin and for agitating the processing chamber vapor mixture supplied to the processing chamber when said at least one rotor is in a rotational mode or operation.

16. A processing system according to claim 1 and wherein the at least one vapor generator is further characterized by a vaporizer jet for mixing source liquid with the at least one feed gas.

17. A processing system for treatment of semiconductor pieces with a vaporous mixture comprising:
    a processing vessel which substantially defines a processing chamber;
    at least one liquid source for providing a source liquid used in producing the vaporous mixture;
    at least one vapor generator; said at least one vapor generator having:
        a vapor generator evaporation chamber;
        a source liquid metering supply for supplying a metered amount of source liquid from the at least one liquid source to the evaporation chamber;

a vapor generator feed gas supply through which a controlled amount of at least one feed gas is supplied to the vapor generator for mixing in the evaporation chamber;

a vaporizer jet for mixing source liquid with the at least one feed gas to provide a vaporizer mixture;

a vaporizer plenum for receiving the vaporizer mixture from the vaporizer jet and providing vaporization of the source liquid contained in the vaporizer mixture;

at least one processing chamber vapor supply in fluid communication with at least one vapor generator to receive at least one vapor generator outflow stream therefrom; the at least one processing chamber vapor supply serving to supply a processing chamber vapor mixture to the processing chamber.

18. A processing system according to claim 17 and wherein the at least one vapor generator is further characterized by a diffuser positioned to influence fluid flow from the vaporizer plenum to effect increased homogeneity in the at least one vapor generator outflow stream emitted from the at least one vapor generator.

19. A processing system according to claim 17 and wherein the at least one vapor generator is further characterized by a diffuser having a plurality of diffusion passages positioned to restrict and mix fluid flow from the vaporizer plenum to effect increased homogeneity in a vapor generator outflow stream emitted from the at least one vapor generator.

20. A processing system for treatment of semiconductor pieces with a vaporous mixture, comprising:

a processing vessel which substantially defines a processing chamber;

at least one liquid source for providing a source liquid used in producing the vaporous mixture;

at least one vapor generator; said at least one vapor generator having means for combining a vapor generator feed gas and said source liquid to produce at least one vapor generator outflow stream containing vaporous source liquid;

a plurality of processing chamber vapor supplies in fluid communication with at least one vapor generator to receive at least one vapor generator outflow stream therefrom; the at least one processing chamber vapor supply serving to supply a processing chamber vapor mixture to the processing chamber at a plurality of positions.

21. A processing system according to claim 20 and further characterized by at least one diluent gas supply connected to mix with the processing chamber vapor mixture supplied to the processing chamber.

22. A processing system according to claim 20 and further characterized by at least one vapor mixer in fluid communication with the at least one vapor generator, for mixing the at least one vapor generator outflow stream with another constituent to produce the processing chamber vapor mixture supplied to the at least one processing chamber vapor supply.

23. A processing system according to claim 20 and further characterized by:

a plurality of vapor generators;

at least one vapor mixer in fluid communication with the plurality of vapor generators to receive a plurality of vapor generator outflow streams therefrom, for mixing the plurality of vapor generator outflow streams to produce the processing chamber vapor mixture.

24. A processing system according to claim 20 and further characterized by:

a plurality of vapor generators;

at least one vapor mixer in fluid communication with the plurality of vapor generators to receive a plurality of vapor generator outflow streams therefrom, for mixing the plurality of vapor generator outflow streams to produce the processing chamber vapor mixture;

at least one diluent gas supply connected to mix with the processing chamber vapor mixture supplied to the processing chamber.

25. A processing system according to claim 20 and further characterized in that there are a plurality of vapor generators.

26. A processing system according to claim 20 and further characterized in that there are a plurality of vapor generators, at least two of the vapor generators being adapted to generate vapor generator outflow streams which are formed using plural source liquids which have differing chemical constituencies.

27. A processing system according to claim 20 and further characterized by at least one heater which provides heat to at least one component of the processing chamber vapor mixture.

28. A processing system according to claim 20 and further characterized by at least one heater for heating gas which passes to the processing chamber via at least one vapor generator.

29. A processing system according to claim 20 and further characterized by at least one heater for at least one source liquid.

30. A processing system according to claim 20 and further characterized by at least one heater for heating feed gas which passes to the processing chamber via at least one vapor generator.

31. A processing system according to claim 20 and further characterized by at least one rotor at least portions of which are mounted within the processing vessel for rotating an array of semiconductor pieces therewithin and for agitating the processing chamber vapor mixture supplied to the processing chamber when said at least one rotor is in a rotational mode of operation.

32. A processing system according to claim 20 and further characterized by at least one rotor at least portions of which are mounted within the processing vessel for rotating at least one semiconductor piece therewithin and for agitating the processing chamber vapor mixture supplied to the processing chamber when said at least one rotor is in a rotational mode of operation.

33. A processing system according to claim 20 and wherein the at least one vapor generator is further characterized by a vaporizer jet for mixing source liquid with the at least one feed gas.

34. A processing system for treatment of semiconductor pieces with a vaporous mixture, comprising:

a processing vessel which substantially defines a processing chamber;

at least one liquid source for providing a source liquid used in producing the vaporous mixture;

at least one vapor generator; said at least one vapor generator having means for combining a vapor generator feed gas and said source liquid to produce at least one vapor generator outflow stream containing vaporous source liquid;

said at least one vapor generator including a vaporizer jet for mixing source liquid with the at least one feed gas to provide a vaporizer mixture, and a vaporizer plenum for receiving the injector mixture from the vaporizer jet and providing vaporization of the source liquid contained in the vaporizer mixture;

at least one processing chamber vapor supply in fluid communication with at least one vapor generator to receive at least one vapor generator outflow stream therefrom; the at least one processing chamber valor supply serving to supply a processing chamber vapor mixture to the processing chamber.

35. A processing system for treatment of semiconductor pieces with a vaporous mixture, comprising:

a processing vessel which substantially defines a processing chamber;

at least one processing chamber vapor supply in fluid communication with the processing chamber to supply a processing chamber vapor mixture to the processing chamber;

a first vapor generator for generating a first vapor generator outflow stream; said first vapor generator having a feed gas supply through which at least one feed gas is supplied thereto;

a first liquid source for supplying a first source liquid to the first vapor generator;

a second vapor generator for generating a second vapor generator outflow stream; said second vapor generator having a feed gas supply through which at least one feed gas is supplied thereto;

a second liquid source for supplying a second source liquid to the second vapor generator;

at least one vapor mixer in fluid communication with the first and second vapor generators so as to receive at least portions of the first and second vapor generator outflow streams therein for mixing; said at least one vapor mixer serving to produce a processing chamber vapor mixture which is supplied to the processing chamber through said at least one processing chamber vapor supply;

at least one source liquid metering supply for supplying a metered amount of source liquid from at least one of said first or second liquid sources to at least one of the first or second vapor generators respectively; and wherein the source liquid metering supply includes a metering pump.

36. A processing system according to claim 35 and further characterized by:

at least one vapor generator evaporation chamber forming a part of at least one of said first or second vapor generators;

at least one source liquid metering supply for supplying a metered amount of source liquid from at least one of said first or second liquid sources to the at least one vapor generator evaporation chamber.

37. A processing system according to claim 35 and further characterized by:

a first vapor generator evaporation chamber forming a part of said first vapor generator;

a first source liquid metering supply for supplying a metered amount of the first source liquid from said first liquid source to the first vapor generator evaporation chamber;

a second vapor generator evaporation chamber forming a part of said second vapor generator;

a second source liquid metering supply for supplying a metered amount of the second source liquid from said second liquid source to the second vapor generator evaporation chamber.

38. A processing system according to claim 35 and further characterized by at least one rotor at least portions of which are mounted within the processing vessel for rotating an array of semiconductor pieces therewithin and for agitating the processing chamber vapor mixture supplied to the processing chamber when said at least one rotor is in a rotational mode of operation.

39. A processing system according to claim 35 wherein said source liquid metering supply is a positive displacement metering pump.

40. A processing system according to claim 35 wherein said source liquid metering supply is a positive displacement metering pump with sensed control of the amount of fluid actually displaced from the metering pump.

41. A processing system for treatment of semiconductor pieces with a vaporous mixture, comprising:

a processing vessel which substantially defines a processing chamber;

at least one processing chamber vapor supply in fluid communication with the processing chamber to supply a processing chamber vapor mixture to the processing chamber;

a first vapor generator for generating a first vapor generator outflow stream; said first vapor generator having a feed gas supply through which at least one feed gas is supplied thereto;

a first liquid source for supplying a first source liquid to the first vapor generator;

a second vapor generator for generating a second vapor generator outflow stream; said second vapor generator having a feed gas supply through which at least one feed gas is supplied thereto;

a second liquid source for supplying a second source liquid to the second vapor generator;

at least one vapor mixer in fluid communication with the first and second vapor generators so as to receive at least portions of the first and second vapor generator outflow streams therein for mixing; said at least one vapor mixer serving to produce a processing chamber vapor mixture which is supplied to the processing chamber through said at least one processing chamber vapor supply;

at least one diluent gas supply in fluid communication with the at least one vapor mixer to provide diluent gas which is mixed to form part of the processing chamber vapor mixture.

42. A processing system according to claim 35 and further characterized by:

a first vapor generator evaporation chamber forming a part of said first vapor generator;

a first source liquid metering supply for supplying a metered amount of the first source liquid from said first liquid source to the first vapor generator evaporation chamber;

a second vapor generator evaporation chamber forming a part of said second vapor generator;

a second source liquid metering supply for supplying a metered amount of the second source liquid from said second liquid source to the second vapor generator evaporation chamber;

at least one diluent gas supply in fluid communication with the at least one vapor mixer to provide diluent gas which is mixed to form part of the processing chamber vapor mixture.

43. A processing system according to claim 35 and further characterized by at least one heater which provides heat to at least one component of the processing chamber vapor mixture.

44. A processing system according to claim 35 and further characterized by at least one heater for heating gas which passes to the processing chamber via at least one vapor generator.

45. A processing system according to claim 35 and further characterized by at least one heater for heating feed gas which passes to the processing chamber via at least one vapor generator.

46. A processing system for treatment of semiconductor pieces with a vaporous mixture, comprising:
   a processing vessel which substantially defines a processing chamber;
   at least one processing chamber vapor supply in fluid communication with the processing chamber to supply a processing chamber vapor mixture to the processing chamber;
   a first vapor generator for generating a first vapor generator outflow stream; said first vapor generator having a feed gas supply through which at least one feed gas is supplied thereto;
   a first liquid source for supplying a first source liquid to the first vapor generator;
   a second vapor generator for generating a second vapor generator outflow stream, said second vapor generator having a feed gas supply through which at least one feed gas is supplied thereto;
   a second liquid source for supplying a second source liquid to the second vapor generator;
   at least one vapor mixer in fluid communication with the first and second vapor generators so as to receive at least portions of the first and second vapor generator outflow streams therein for mixing said at least one vapor mixer serving to produce a processing chamber vapor mixture which is supplied to the processing chamber through said at least one processing chamber vapor supply;
   at least one rotor at least portions of which are mounted within the processing vessel for rotating an array of semiconductor pieces therewithin and for agitating the processing chamber vapor mixture supplied to the processing chamber when said at least one rotor is in a rotational mode of operation.

47. A processing system for treatment of semiconductor pieces with a vaporous mixture, comprising:
   a processing vessel which substantially defines a processing chamber;
   at least one processing chamber vapor supply in fluid communication with the processing chamber to supply a processing chamber vapor mixture to the processing chamber;
   a first vapor generator for generating a first vapor generator outflow stream; said first vapor generator having a feed gas supply through which at least one feed gas is supplied thereto;
   a first liquid source for supplying a first source liquid to the first vapor generator;
   a second vapor generator for generating a second vapor generator outflow stream; said second vapor generator having a feed gas supply through which at least one feed gas is supplied thereto;
   a second liquid source for supplying a second source liquid to the second vapor generator;
   at least one vapor mixer in fluid communication with the first and second vapor generators so as to receive at least portions of the first and second vapor generator outflow streams therein for mixing; said at least one vapor mixer serving to produce a processing chamber vapor mixture which is supplied to the processing chamber through said at least one processing chamber vapor supply;
   a plurality of processing chamber vapor supplies which allow the processing chamber vapor mixture to be introduced into the processing chamber from a plurality of positions.

48. A processing system according to claim 35 and wherein the at least one vapor generator is further characterized by a vaporizer jet for mixing source liquid with the at least one feed gas.

49. A processing system for treatment of semiconductor pieces with a vaporous mixture, comprising:
   a processing vessel which substantially defines a processing chamber,
   at least one processing chamber vapor supply in fluid communication with the processing chamber to supply a processing chamber vapor mixture to the processing chamber;
   a first vapor generator for generating a first vapor generator outflow stream; said first vapor generator having a feed gas supply through which at least one feed gas is supplied thereto;
   a first liquid source for supplying a first source liquid to the first vapor generator;
   a second vapor generator for generating a second vapor generator outflow stream; said second vapor generator having a feed gas supply through which at least one feed gas is supplied thereto;
   a second liquid source for supplying a second source liquid to the second vapor generator;
   at least one vapor mixer in fluid communication with the first and second vapor generators so as to receive at least portions of the first and second vapor generator outflow streams therein for mixing; said at least one vapor mixer serving to produce a processing chamber vapor mixture which is supplied to the processing chamber through said at least one processing chamber vapor supply;
   a vaporizer jet for mixing source liquid with the at least to one feed gas to provide a vaporizer mixture;
   a vaporizer plenum for receiving the vaporizer mixture from the injector and providing vaporization of the source liquid contained in the vaporizer mixture.

50. A processing system according to claim 49 and wherein the at least one vapor generator is further characterized by
   a diffuser positioned to influence fluid flow from the vaporizer plenum to effect increased homogeneity in the at least one vapor generator outflow stream emitted from the at least one vapor generator.

51. A processing system according to claim 49 and wherein the at least one vapor generator is further characterized by
   a diffuser having a plurality of diffusion passages positioned to restrict and mix fluid flow from the vaporizer plenum to effect increased homogeneity in a vapor generator outflow stream emitted from the at least one vapor generator.

52. A processing system for treatment of semiconductor pieces with a vaporous mixture, comprising:
- a processing vessel which substantially defines a processing chamber;
- at least one processing chamber vapor supply in fluid communication with the processing chamber to supply a processing chamber vapor mixture to the processing chamber;
- a first vapor generator for generating a first vapor generator outflow stream; said first vapor generator having a feed gas supply through which at least one feed gas is supplied thereto;
- a first liquid source for supplying a first source liquid to the first vapor generator;
- a second vapor generator for generating a second vapor generator outflow stream, said second vapor generator having a feed gas supply through which at least one feed gas is supplied thereto;
- a second liquid source for supplying a second source liquid to the second vapor generator;
- at least one vapor mixer in fluid communication with the first and second vapor generators so as to receive at least portions of the first and second vapor generator outflow streams therein for mixing; said at least one vapor mixer serving to produce a processing chamber vapor mixture which is supplied to the processing chamber through said at least one processing chamber vapor supply;
- wherein the at least one vapor mixer has a mixing chamber and a plurality of mixer inputs; said mixer inputs being in fluid communication with a mixing chamber; said mixer inputs being oriented to be in a convergent input pattern.

53. A processing system for treatment of semiconductor pieces with a vaporous mixture, comprising:
- a processing vessel which is capable of being substantially closed to define a substantially enclosed processing chamber;
- at least one vapor generator; said at least one vapor generator having:
  - a liquid compartment for holding a source liquid therein;
  - a vapor generator feed gas supply through which at least one feed gas is supplied to the vapor generator;
  - a feed gas director in fluid communication with the vapor generator feed gas supply to direct feed gas into interaction with source liquid held in the liquid compartment;
  - a vapor receiver for receiving vapor generated by interaction of the feed gas with the source liquid;
  - at least one vapor generator output in fluid communication with the vapor receiver and through which a vapor generator outflow stream flows from the vapor generator;
- at least one exsiccator for desaturating at least one vapor generator outflow stream;
- at least one processing chamber vapor supply in fluid communication to receive at least one vapor generator outflow stream; the processing chamber vapor supply serving to supply a processing chamber vapor mixture to the processing chamber.

54. A processing system according to claim 53 and further characterized by said at least one exsiccator having at least one vapor generator cooling unit for cooling the vapor generator outflow stream.

55. A processing system according to claim 53 and further characterized by said at least one exsiccator having at least one vapor generator heating unit for heating at least one vapor generator.

56. A processing system according to claim 53 and further characterized by said at least one exsiccator having:
- at least one vapor generator cooling unit for cooling the vapor generator outflow stream flowing from at least one vapor generator output;
- at least one vapor generator heating unit for heating at least one vapor generator.

57. A processing system for treatment of semiconductor pieces with a vaporous mixture, comprising:
- a processing vessel which is capable of being substantially closed to define a substantially enclosed processing chamber;
- at least one vapor generator; said at least one vapor generator having:
  - a liquid compartment for holding a source liquid therein;
  - a vapor generator feed gas supply through which at least one feed gas is supplied to the vapor generator;
  - a feed gas director in fluid communication with the vapor generator feed gas supply to direct feed gas into interaction with source liquid held in the liquid compartment;
  - a vapor receiver for receiving vapor generated by interaction of the feed gas with the source liquid;
  - at least one vapor generator output in fluid communication with the vapor receiver and through which a vapor generator outflow stream flows from the vapor generator;
- at least one processing chamber vapor supply in fluid communication with at least one vapor generator output to receive at least one vapor generator outflow stream; the processing chamber vapor supply serving to supply a processing chamber vapor mixture to the processing chamber;
- at least one vapor generator cooling unit for cooling at least one vapor generator outflow stream.

58. A processing system for treatment of semiconductor pieces with a vaporous mixture, comprising:
- a processing vessel which is capable of being substantially closed to define a substantially enclosed processing chamber;
- at least one vapor generator; said at least one vapor generator having:
  - a liquid compartment for holding a source liquid therein;
  - a vapor generator feed gas supply through which at least one feed gas is supplied to the vapor generator;
  - a feed gas director in fluid communication with the vapor generator feed gas supply to direct feed gas into interaction with source liquid held in the liquid compartment;
  - a vapor receiver for receiving vapor generated by interaction of the feed gas with the source liquid;
  - at least one vapor generator output in fluid communication with the vapor receiver and through which a vapor generator outflow stream flows from the vapor generator;
- at least one processing chamber vapor supply in fluid communication with at least one vapor generator output to receive at least one vapor generator outflow stream; the processing chamber vapor supply serving to supply a processing chamber vapor mixture to the processing chamber;

at least one vapor generator heating unit for heating at least one vapor generator.

59. A processing system for treatment of semiconductor pieces with a vaporous mixture, comprising:
- a processing vessel which is capable of being substantially closed to define a substantially enclosed processing chamber;
- at least one vapor generator; said at least one vapor generator having:
  - a liquid compartment for holding a source liquid therein;
  - a vapor generator feed gas supply through which at least one feed gas is supplied to the vapor generator;
  - a feed gas director in fluid communication with the vapor generator feed gas supply to direct feed gas into interaction with source liquid held in the liquid compartment, the feed gas director including at least one baffle which directs the flow of feed gas;
  - a vapor receiver for receiving vapor generated by interaction of the feed gas with the source liquid;
  - at least one vapor generator output in fluid communication with the vapor receiver and through which a vapor generator outflow stream flows from the vapor generator;
- at least one processing chamber vapor supply in fluid communication with at least one vapor generator output to receive at least one vapor generator outflow stream; the processing chamber vapor supply serving to supply a processing chamber vapor mixture to the processing chamber.

60. A processing system according to claim 59, and further characterized in that the feed gas director includes at least one baffle which defines a convoluted flow path for the feed gas.

61. A processing system according to claim 59 and further characterized in that the feed gas director includes at least one baffle which impedes flow of vapors from the liquid compartment to the vapor receiver.

62. A processing system for treatment of semiconductor pieces with a vaporous mixture, comprising:
- a processing vessel which is capable of being substantially closed to define a substantially enclosed processing chamber;
- at least one processing chamber vapor supply in fluid communication with the substantially enclosed processing chamber to supply a processing chamber vapor mixture to the processing chamber;
- a plurality of vapor generators for generating plural vapor generator outflow streams; said plurality of vapor generators having at least one feed gas supply through which at least one feed gas is supplied thereto and a feed gas director in fluid communication with the feed gas supply and configured to direct the feed gas within the vapor generators;
- at least one diluent gas supply;
- at least one vapor mixer in fluid communication with the plurality of vapor generators and the at least one diluent gas supply to produce a processing chamber vapor mixture which is supplied to the processing chamber through the at least one processing chamber vapor supply.

63. A processing system for treatment of semiconductor pieces with a vaporous mixture, comprising:
- a processing vessel which is capable of being substantially closed to define a substantially enclosed processing chamber;
- at least one processing chamber vapor supply in fluid communication with the substantially enclosed processing chamber to supply a processing chamber vapor mixture to the processing chamber;
- at least one vapor generator for generating at least one vapor generator outflow stream; said at least one vapor generator having at least one feed gas supply through which at least one feed gas is supplied thereto and a feed gas director in fluid communication with the feed gas supply and configured to direct the feed gas within the vapor generator;
- at least one exsiccator for desaturating the at least one vapor generator outflow stream.

64. A processing system according to claim 63 and further characterized by said at least one exsiccator having at least one vapor generator cooling unit for cooling the vapor generator outflow stream.

65. A processing system according to claim 63 and further characterized by said at least one exsiccator having at least one vapor generator heating unit for heating at least one vapor generator.

66. A processing system according to claim 63 and further characterized by said at least one exsiccator having:
- at least one vapor generator cooling unit for cooling the vapor generator outflow stream flowing from at least one vapor generator output;
- at least one vapor generator heating unit for heating at least one vapor generator.

67. A processing system for treatment of semiconductor pieces with a vaporous mixture, comprising:
- a processing vessel which is capable of being substantially closed to define a substantially enclosed processing chamber;
- at least one processing chamber vapor supply in fluid communication with the substantially enclosed processing chamber to supply a processing chamber vapor mixture to the processing chamber;
- at least one vapor generator for generating at least one vapor generator outflow stream; said at least one vapor generator having at least one feed gas supply through which at least one feed gas is supplied thereto and a feed gas director in fluid communication with the feed gas supply and configured to direct the feed gas within the vapor generator;
- at least one vapor generator cooling unit for cooling at least one vapor generator outflow stream.

68. A processing system for treatment of semiconductor pieces with a vaporous mixture, comprising:
- a processing vessel which is capable of being substantially closed to define a substantially enclosed processing chamber;
- at least one processing chamber vapor supply in fluid communication with the substantially enclosed processing chamber to supply a processing chamber vapor mixture to the processing chamber;
- at least one vapor generator for generating at least one vapor generator outflow stream; said at least one vapor generator having at least one feed gas supply through which at least one feed gas is supplied thereto and a feed gas director in fluid communication with the feed gas supply and configured to direct the feed gas within the vapor generator;
- at least one vapor generator heating unit for heating at least one vapor generator outflow stream.

69. A processing system for treatment of semiconductor pieces with a vaporous mixture, comprising:
- a processing vessel which is capable of being substantially closed to define a substantially enclosed processing chamber;
- at least one processing chamber vapor supply in fluid communication with the substantially enclosed processing chamber to supply a processing chamber vapor mixture to the processing chamber;
- at least one vapor generator for generating at least one vapor generator outflow stream; said at least one vapor generator having at least one feed gas supply through which at least one feed gas is supplied thereto and a feed gas director in fluid communication with the feed gas supply and configured to direct the feed gas within the vapor generator;
- wherein the at least one vapor generator includes at least one baffle for directing flow of at least one generator feed gas adjacent to source liquid.

70. A processing system according to claim 69 and further characterized in that the at least one baffle impedes flow of vapors from the liquid compartment to the vapor receiver.

71. A processing system according to claim 69 and further characterized in that the at least one baffle defines a convoluted flow path for the feed gas.

* * * * *